US 6,600,216 B1

United States Patent
Shieh et al.

(10) Patent No.: US 6,600,216 B1
(45) Date of Patent: Jul. 29, 2003

(54) STRUCTURE OF A PIN PLATFORM FOR INTEGRATED CIRCUIT

(75) Inventors: Wen-Lo Shieh, Taipei (TW); Chia-Ming Yang, Taipei (TW); Chen-Fa Tsai, Taipei (TW); Shu-Fen Liang, Taipei (TW); Shu-Min Chou, Taipei (TW)

(73) Assignee: Orient Semiconductor Electronics Limited, Kaohsiung (TW)

( * ) Notice: Subject to any disclaimer, the term of this patent is extended or adjusted under 35 U.S.C. 154(b) by 0 days.

(21) Appl. No.: 10/138,481

(22) Filed: May 6, 2002

(30) Foreign Application Priority Data

Jan. 16, 2002 (TW) ........................ 91200463 U

(51) Int. Cl.⁷ .................... H01L 23/495; H01L 23/48
(52) U.S. Cl. .................... 257/666; 257/783; 257/691; 257/674
(58) Field of Search ................ 257/666, 787, 257/783, 691, 670, 674

(56) References Cited

U.S. PATENT DOCUMENTS

| 4,868,635 A | * | 9/1989 | Frechette et al. | ........... 257/666 |
|---|---|---|---|---|
| 5,623,123 A | * | 4/1997 | Umehara | .......... 174/52.2 |
| 6,101,101 A | * | 8/2000 | Tzu et al. | ............ 361/808 |
| 6,198,171 B1 | * | 3/2001 | Huang et al. | ........... 257/787 |
| 6,291,273 B1 | * | 9/2001 | Miyaki et al. | ........... 438/123 |
| 6,383,842 B1 | * | 5/2002 | Takashima et al. | ........ 438/115 |
| 6,441,400 B1 | * | 8/2002 | Miyaki et al. | ........... 257/666 |

FOREIGN PATENT DOCUMENTS

JP 3-32048 * 12/1991 ............ 257/666

* cited by examiner

Primary Examiner—Jasmine J B Clark
(74) Attorney, Agent, or Firm—Leong C. Lei

(57) ABSTRACT

An improved structure of a pin platform of an integrated circuit having a pin platform body including a chip seat and a plurality of leading plates having their end portions being concentrated on the chip seat and the chip seat being connected to the pin platform body via the connection plate, characterized in that the surrounding of the chip seat is provided with a framing side, and the framing side is connected to a connection plate, and the surface of the chip seat is smaller than the connection surface of the IC to be installed, and the size of the framing side is larger than the size of the connection face of the IC. Therefore, a high performance greenery package is obtained and the ground wire of the IC can be soldered to the framing side, which provides a smooth connection and a communication.

1 Claim, 5 Drawing Sheets

STRUCTURE OF A PIN PLATFORM FOR INTEGRATED CIRCUIT

BACKGROUND OF THE INVENTION (a) Technical Field of the Invention

The present invention relates to an improved structure of a pin platform for integrated circuit (IC), and in particular, a pin platform which can achieve high performance greenery package and at the same time, proceed to manufacture of ground wires.

(b) Description of the Prior Art

Referring to FIG. 1, there is shown an integrated circuit 10 which is adhered onto the chip seat 12 of the pin platform 11, and after the fabrication of the wires, a packaging is provided to form into a protective housing 13. In the process of wire forming, one or more than one ground wires 14 are soldered onto the chip seat 12. Conventional material is for packaging IC contains lead, and halides which are toxic material. As a result of these toxic materials, zinc, silver and copper alloy are used to replace lead. However, the melting points of zinc, silver and copper alloy are higher than that of lead alloy and the area of the chip seat 12 is larger than the IC 10. As a result, in the entire process, the packaging material of the greenery device will be stripped as a result of temperature effect and the defect of the product causes the product cannot be utilized. As shown in FIG. 2, in order to improve the above stripping phenomenon, the area of the chip seat 22 of the pin platform 21 is reduced into an area smaller than that of the IC 20, where the smaller contact area to effectively lower the stripping phenomenon of the chip seat 22 and the protective housing 23 to achieve high performance greenery device. However, the ground wire of the IC 20 lacks the soldering wire region as a result of chip seat 22 being smaller than the area of IC, the manufacturing of soldering wires for grounding wire cannot be achieved. Therefore, the pin platform 21 will reduce the range of application and does not possess practicability.

SUMMARY OF THE INVENTION

Accordingly, it is an object of the present invention to provide an improved structure of a pin platform for integrated circuit, wherein the manufacturing process of the soldering line for floor wire can be improved and at the same time a high performance greenery package can be obtained.

Yet another object of the present invention is to provide an improved structure of a pin platform of an integrated circuit having a pin platform body including a chip seat and a plurality of leading plates having their end portions being concentrated on the chip seat and the chip seat being connected to the pin platform body via the connection plate, characterized in that the surrounding of the chip seat is provided with a framing side, and the framing side is connected to a connection plate, and the surface of the chip seat is smaller than the connection surface of the IC to be installed, and the size of the framing side is larger than the size of the connection face of the IC, thereby the ground wire of the IC is connected to the framing side.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
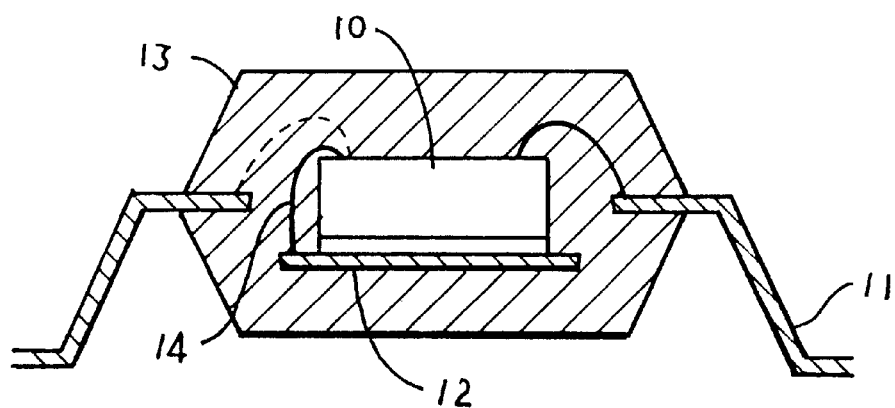
FIG. 1 is a sectional view of a conventional IC package.
Figure 2:
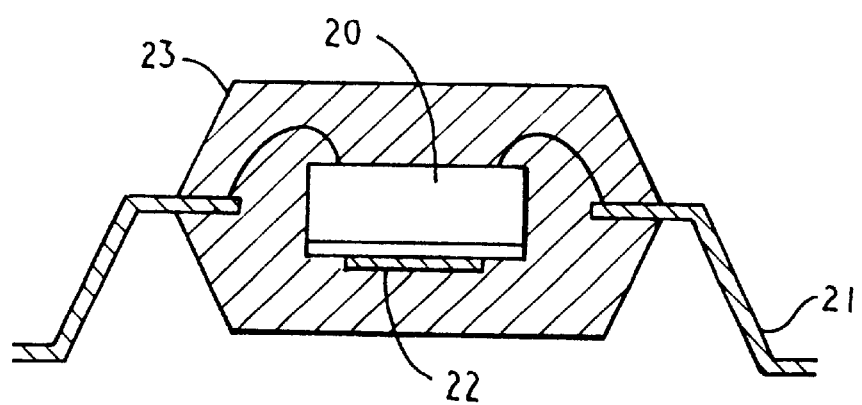
FIG. 2 is a sectional view of another conventional IC package.
Figure 3:
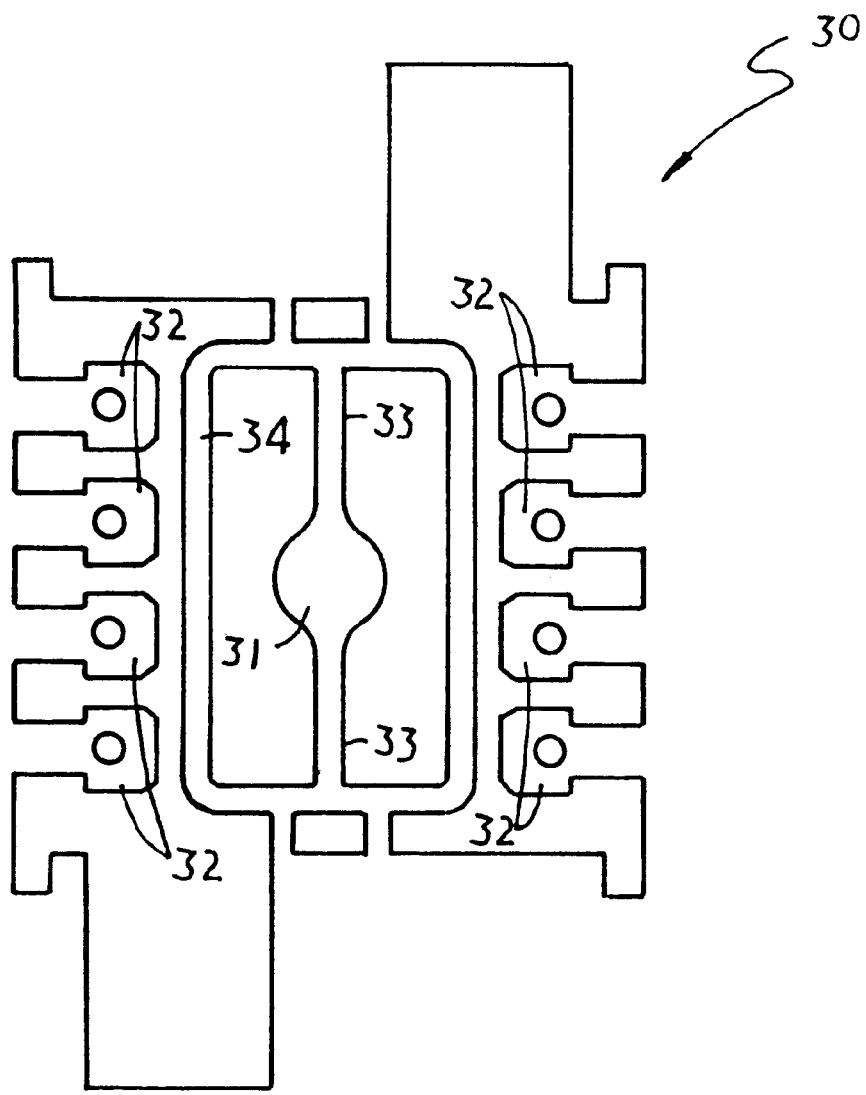
FIG. 3 is a top view of the structure of a pin platform for an IC in accordance with the present invention.

Referring to FIG. 3, there is shown the pin platform body 30 comprising a chip seat 31 and a plurality of leading plates 32 having their end portions being concentrated at the chip seat 31, and the chip seat 31 is connected to the pin platform body 30 via a connection plate 33, and the surrounding of the chip seat 31, a framing side 34 is provided. The framing side 34 is connected to the connection area of the connection plate 33, and the size of the framing side 34 must be larger than the size of connection of the IC 40.

Figure 4:
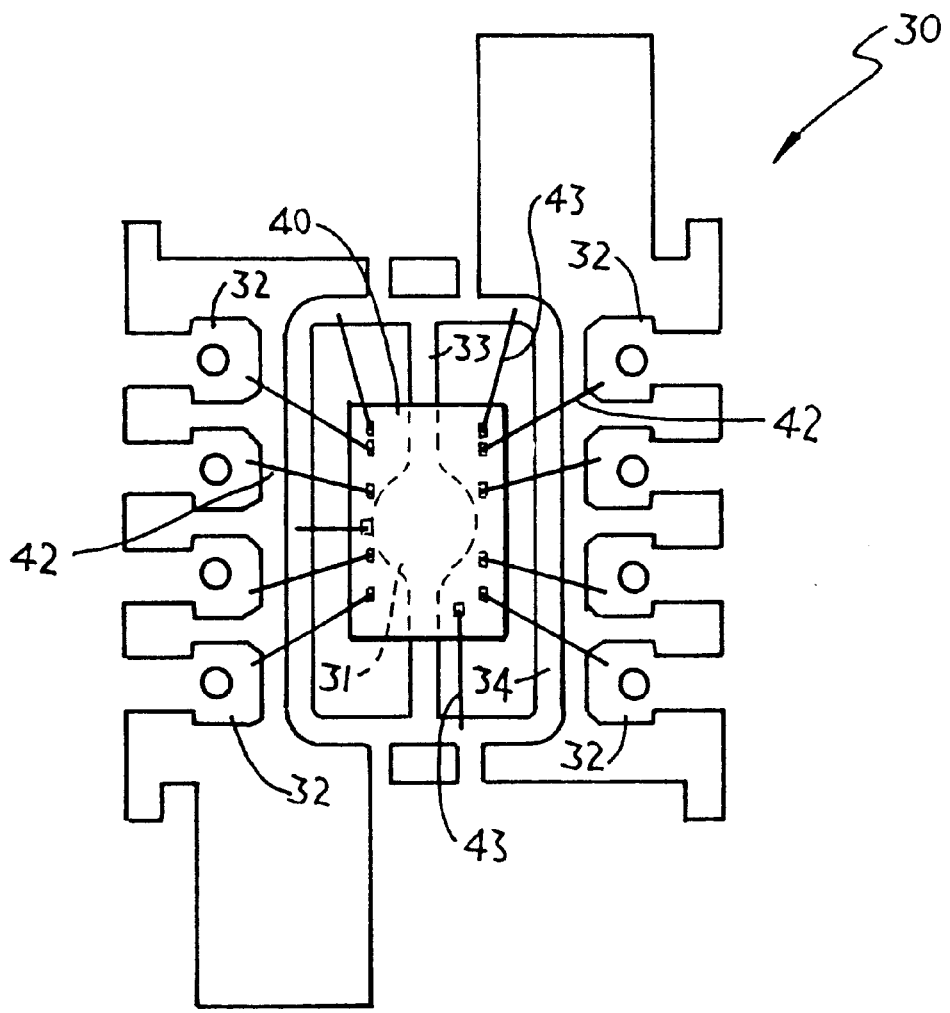
FIG. 4 is a top view, schematically showing the mounting of IC in accordance with the present invention.
Figure 5:
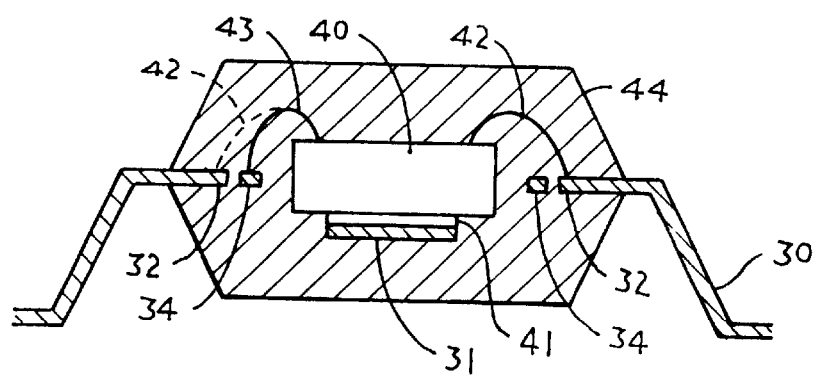
FIG. 5 is a sectional view of the present structure after packaging.

Referring to FIGS. 4 and 5, the IC 40 is adhered onto the chip seat 31 of the pin platform 30 with an adhesive 41, and via wire-forming process, a plurality of signal connection points formed on the surface of IC 40 are connected to a plurality of leading plates 32 by leading wires 42, in particular, the ground wire 43 of the IC 40 is soldered at the framing side 34 such that the ground wire 43 can be smoothly connected and in communication.

Finally, packaging process is performed to form a protective housing 44. In accordance with the present invention, the advantages of the pin platform are as follows:

(1) The area of the chip seat 31 of the pin platform body 30 is smaller than that of the IC 40, therefore, smaller contact area will effectively reduce the stripping phenomenon of the chip seat 31 and the protective housing 44. Thus, high performance greenery package can be obtained.

(2) The surrounding of the chip seat 31 is provided with a framing side 34, and the size of the framing side 34 is larger than that of the IC 40 such that the ground wire 43 of the IC 40 can be soldered to the framing side 34 and the ground wire 43 can be smoothly connected and is in communication.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A structure of a pin platform of an integrated circuit having a pin platform body including a chip seat and a plurality of leading plates, end portions of the leading plates being disposed on the chip seat and the chip seat being connected to the pin platform body via a connection plate, wherein the chip seat is provided with a framing side, and the framing side is connected to the connection plate, and surface of the chip seat is smaller than a connection surface of an IC to be installed, and size of the framing side is larger than size of the connection surface of the IC, whereby a ground wire of the IC can be connected to the framing side.

* * * * *